(12) United States Patent
Henzler

(10) Patent No.: US 10,250,279 B2
(45) Date of Patent: Apr. 2, 2019

(54) CIRCUITS AND METHODS FOR WRITING AND READING DATA

(71) Applicant: Infineon Technologies AG, Neubiberg (DE)

(72) Inventor: Julie Henzler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/602,488

(22) Filed: May 23, 2017

(65) Prior Publication Data

US 2017/0346505 A1 Nov. 30, 2017

(30) Foreign Application Priority Data

May 25, 2016 (DE) .......................... 10 2016 209 154

(51) Int. Cl.
*G11C 29/00* (2006.01)
*H03M 13/11* (2006.01)
*H03M 13/00* (2006.01)

(52) U.S. Cl.
CPC .......... *H03M 13/11* (2013.01); *H03M 13/611* (2013.01)

(58) Field of Classification Search
CPC ............................ H03M 13/11; H03M 13/611
See application file for complete search history.

(56) References Cited

U.S. PATENT DOCUMENTS

| | | | |
|---|---|---|---|
| 6,003,144 A | 12/1999 | Olarig et al. | |
| 6,751,769 B2 * | 6/2004 | Chen .................... | G06F 11/1016 714/767 |
| 7,293,221 B1 * | 11/2007 | Wong .................. | G06F 11/1016 714/768 |
| 2006/0117239 A1 * | 6/2006 | Lin ........................ | G11B 20/00 714/758 |
| 2006/0156191 A1 | 7/2006 | Driediger | |
| 2013/0080854 A1 * | 3/2013 | Nicholas ............. | G06F 11/1016 714/758 |

* cited by examiner

*Primary Examiner* — Samir W Rizk
(74) *Attorney, Agent, or Firm* — Eschweiler & Potashnik, LLC

(57) ABSTRACT

A writing circuit for writing write data into a memory comprises an evaluator configured for providing an error handling code on the basis of the write data. A modifier reversibly modifies extended write data comprising both the write data and the error handling code in dependence on address information related to a writing address in order to provide modified extended write data. A writer writes the modified extended write data in a position of the memory defined by a writing address. A reading circuit for reading extended read data from a memory comprises a reader configured for reading the extended read data from a position of the memory defined by a reading address. A de-modifier modifies the extended read data in dependence on address information related to a reading address in order to provide extracted read data and an extracted error handling code. An error-detector detects based on the extracted error handling code whether the extracted read data comprises an error.

20 Claims, 3 Drawing Sheets

CIRCUITS AND METHODS FOR WRITING AND READING DATA

CROSS REFERENCE TO RELATED APPLICATIONS

This application claims priority to German Application number 10 2016 209 154.9, filed on May 25, 2016, the contents of which are incorporated by reference in their entirety.

FIELD

This disclosure relates in general to circuits and methods, and more particularly to a writing circuit for writing write data into a memory, a method for writing write data into a memory, a reading circuit for reading extended read data from a memory, and a method for reading extended read data from a memory.

BACKGROUND

A technique for detecting bit errors of binary data uses a parity or check bit based on the number of bits in a string or word having value one. The parity bit—as one example of an error detection code—allows to detect errors during a reading or writing operation of a data word. The parity bit is concatenated to the data word. Other techniques use different error handling code for detecting and even correction errors of data words.

In general, the used techniques cause additional error handling code that allows at least the detection of errors and sometimes also the correction of the detected errors. The error handling code in the last case is usually called "error correction code" or "error correcting code" or "Error Checking and Correction", all abbreviated by ECC. The respective code is concatenated to the corresponding data word or stored separately.

Errors can occur during write operations and during read operations. In the first case data is written over existing data in a memory and the data is not accessible at the intended address in the memory. In the second case the data read from a wrong place is returned as wrong data. If a code covers the writing and reading operation, the writing unit and the reading unit, both, have to use the same error detection technique and enough memory space for handling the respective error detection code must be available.

SUMMARY

In an embodiment, a writing circuit for writing write data into a memory comprises an evaluator configured for providing an error handling code on the basis of the write data. The writing circuit also comprises a modifier configured for providing modified extended write data. The modifier is configured to reversibly modify extended write data comprising both the write data and the error handling code in dependence on address information related to a writing address in order to provide the modified extended write data. The writing circuit further comprises a writer configured for writing the modified extended write data in a position of the memory defined by a writing address.

In a different embodiment, a method for writing write data into a memory comprises providing an error handling code based on the write data. Extended write data comprising both the write data and the error handling code is reversibly modified in dependence on address information related to a writing address in order to provide modified extended write data. The modified extended write data is written in a position of the memory defined by a writing address.

In a further embodiment, a reading circuit for reading extended read data from a memory comprises a reader configured for reading the extended read data from a position of the memory defined by a reading address. The reading circuit comprises further a de-modifier configured for modifying the extended read data in dependence on address information related to a reading address in order to provide extracted read data and an extracted error handling code. The reading circuit also comprises an error-detector configured for detecting based on the extracted error handling code whether the extracted read data comprises an error.

In a further embodiment, a method for reading extended read data from a memory comprises reading the extended read data from a position of the memory defined by a reading address. The extended read data is modified in dependence on address information related to a reading address in order to provide extracted read data and an extracted error handling code. The method further comprises detecting based on the extracted error handling code whether the extracted read data comprises an error.

The details of one or more embodiments are set forth in the accompanying drawings and the description below. Other features, objects, and advantages will be apparent for the description and drawings, and from the claims.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the disclosure, and do not limit the scope.

Figure 1:
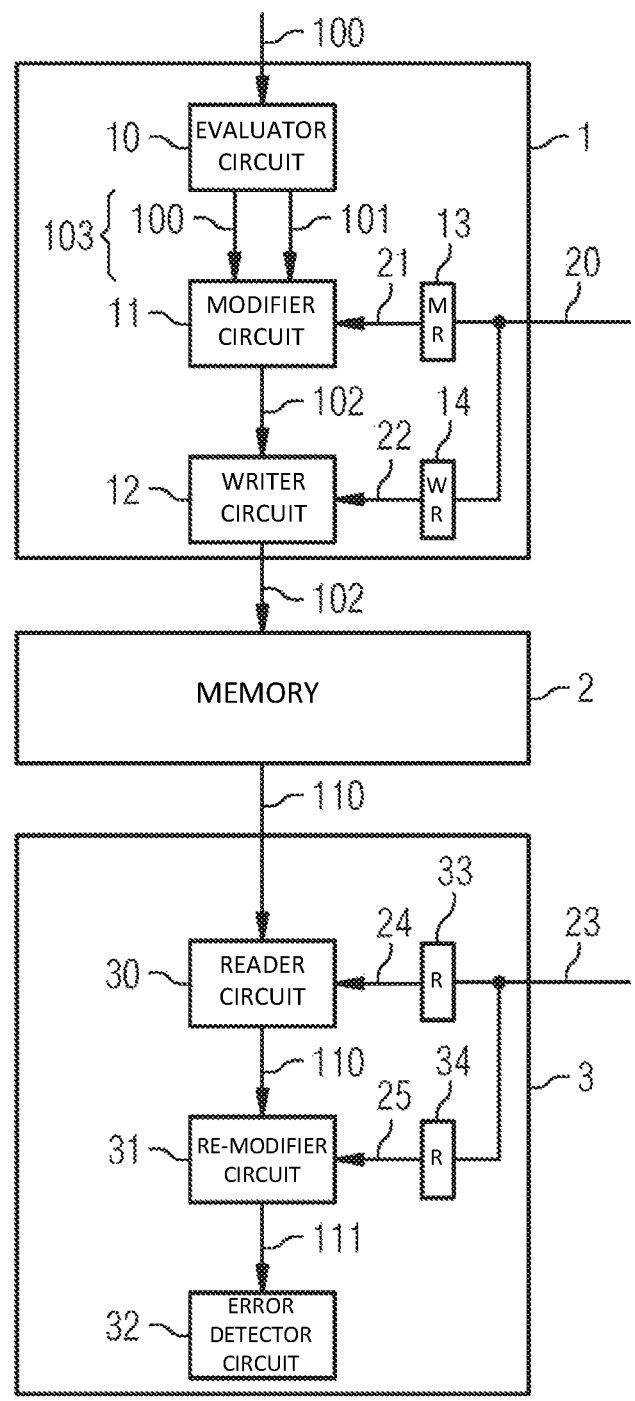
FIG. 1 shows a schematic arrangement of embodiments of a writing circuit, a reading circuit, and a memory.

FIG. 1 illustrates an embodiment of a writing circuit 1 for writing data 100 into a memory 2 as well as a reading circuit 3 for reading extended read data 110 from—here the same—memory 2. In one embodiment, the memory 2 is a flash memory.

The writing circuit 1 is configured for writing write data 100 into a memory 2 at a position of the memory 2 associated with a given writing address 20. The writing circuit 1 is provided with the write data 100 and the writing address 20.

An evaluator 10 of the writing circuit 1 provides an error handling code 101 on the basis of the write data 100. The error handling code 101 is in one embodiment an Error Correcting Code (ECC, an alternative name is: Error Checking and Correction) allowing to identify and to correct errors of the data associated with the ECC. The error handling code 101 is in one embodiment based on the Hamming code. In an alternative embodiment, the error handling code 101 allows only to detect an error. In one associated embodiment, the error handling code 101 is based on a checksum of the write data 100. Hence, the error handling code 101 at least allows the detection of an error in the associated data (this is here the write data 100) and allows in some embodiments also the correction of a detected error.

The write data 100—here passed through by the evaluator 10—and the error handling code 101 are submitted to a modifier 11 that is configured for providing modified extended write data 102. The write data 100 and the error handling code 101, both, are comprised by extended write data 103 being in one embodiment one single string or data word and being in a different embodiment a combination of at least two data strings or data words. The extended write data 103 is reversibly modified by the modifier 11 in dependence on address information related to a writing address 21 in order to provide the modified extended write data 102. The modification is done reversible in order to allow—during the in the following explained reading operation—an inverse modification or a de-modification of the modified extended data 102 leading to the original extended data 103. The modifier 11 obtains the writing address 21 for performing the modification from a modifier-register 13 which is, thus, associated with the modifier 11 and comprised by the writing circuit 1.

One embodiment deals with a case of a write data 100 comprising only Zero-Values. This is in one embodiment associated with deleted data. The error handling code 101 accordingly also contains just zeros. In this case, the modifier 11 of this embodiment encodes the extended write data 103 is such a way that the resulting modified extended write data 102 does not lead to a valid data, e.g., by changing at least one bit of the extended write data 103. This aims at avoiding that the word "0" becomes due to the modification by the address a valid word.

In the shown embodiment, the writing address 20 received by the writing circuit 1 is written into two different registers 13, 14 of the writing circuit 1. In a different—not shown—embodiment, the writing address 20 is written into one register implying that the modifier-register 13 and the writer-register 14 are identical. In computer or circuit architecture, a processor register is a quickly accessible location available to a digital processor's central processing unit (CPU). Registers consisting usually of a small amount of fast storage are typically addressed by mechanisms other than main memory. The modifier-register 13 provides the writing address 21 for the modifier 11. The writer-register 14 provides the writing address 22 for the writer 12 which also requires this information. The writing address 20 submitted to the writing circuit 1 is, accordingly, written to both registers 13, 14. If putting the writing address 20 into the registers 13, 14 and retrieving it from there, was flawless, then all three writing addresses 20, 21, and 22 are identical. This means that the modifier 11 and the writer 12 use the writing address 20 given to the writing circuit 1 but taken from different registers 13, 14.

The writer 12 is configured for writing the modified extended write data 102 in a position (in the following sometimes referred to as memory position) of the memory 2 which is defined by the writing address 22 obtained from the writer-register 14 and which is in the best case identical with the writing address 22 used by the modifier 11 and the writing address 20 received by the writing circuit 1. The writer 12, thus, writes the modified version of the error handling code 101 and the modified version of the write data 100, both, as elements of the modified extended write data 102 in a position of the memory 2 specified by the writing address 22. In an embodiment, the modified extended write data 102 is written by the writer 12 in more than one position of the memory 2 specified by the writing address 22.

The method for writing write data 100 into a memory 2 can be described as comprising at least the following steps:
Providing an error handling code 101 based on the write data 100 to be written into the memory 2.
Reversibly modifying extended write data 103 comprising both the write data 100 and the error handling code 101 in dependence on address information related to a writing address 21 in order to provide modified extended write data 102.
Writing the modified extended write data 102 in a position of the memory 2 defined by a writing address 22.

According to the method, the write data 100 and the corresponding error handling code 101 are modified by address information related to a writing address 20, 21. Due to this, both carry at least some information about the given writing address 20.

In the embodiment shown in FIG. 1, the writing address used for the modification step and used for the writing step are taken from two different registers compromised by the writing circuit 1. Hence, before the respective steps, the writing address 20 is written into the different registers 13, 14.

The memory 2 contains the modified extended write data 102 compromising the write data 100, the associated error handling code 101, and the writing address 20 which is in the best case the address defining the position of the modified extended write data 102 within the memory 2.

The reading circuit 3 allows detecting whether errors have happened during the writing operation or during the reading operation. For this purpose the error handling code is used which is provided for detecting whether the data as such comprises an error.

In the shown embodiment, the reading circuit 3 for reading extended read data 110 from the memory 2 comprises a reader 30. The reader 30 is configured for reading the extended read data 110 from a position of the memory 2 defined by a reading address 24. In an embodiment, the reading address 24 defines more than one memory positions in which the extended read data 110 is located. Hence, in this embodiment, the reader 30 is configured to read the extended read data 110 from various memory positions. In the shown embodiment, the reader 30 receives the reading address 24—associated with one memory position—from a reader-register 33 into which the reading address 23 was written.

Figure 2:
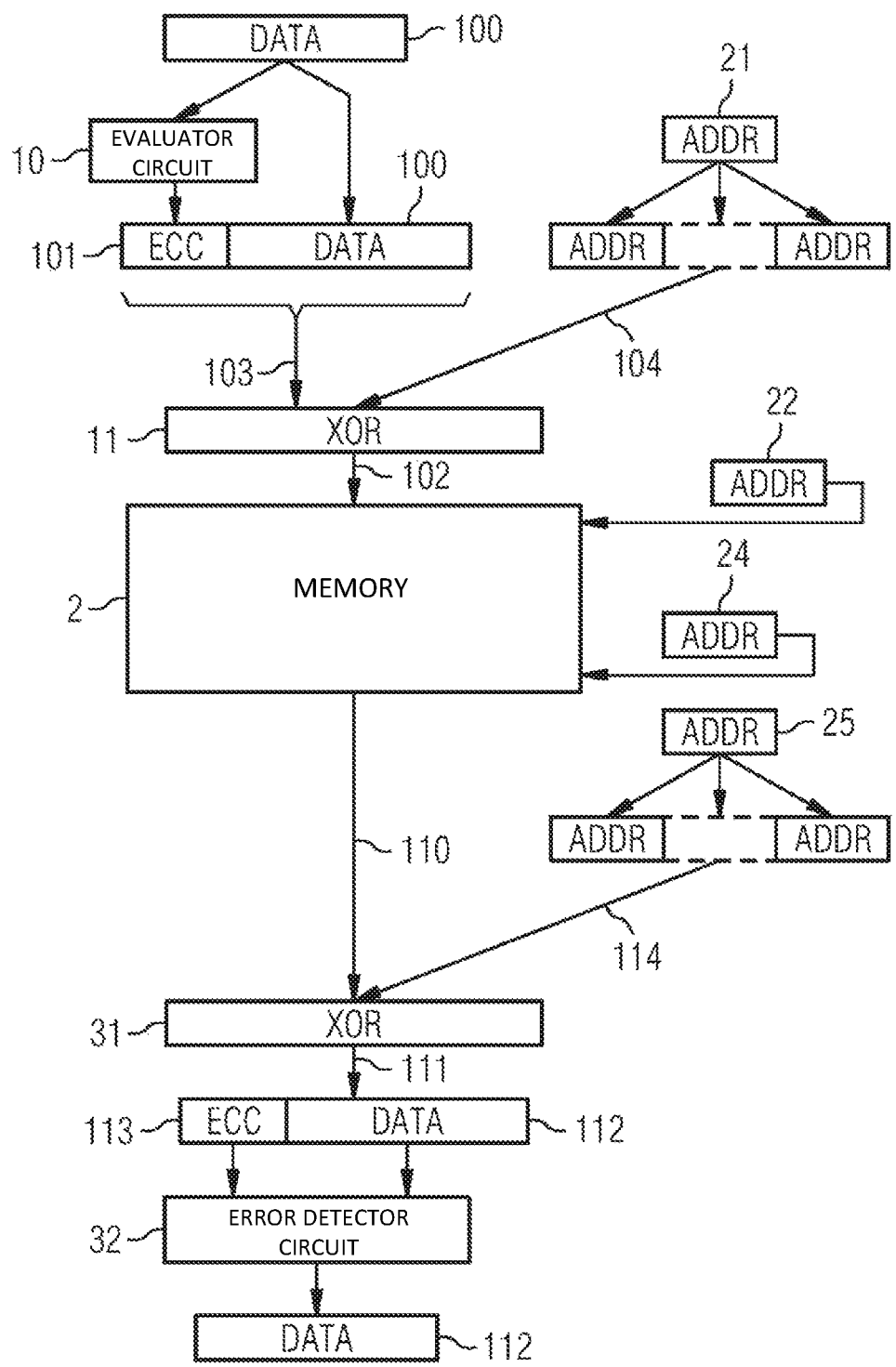
FIG. 2 illustrates an arrangement similar to FIG. 1 with implementation details.

The given reading address 23 was also written into a different de-modifier register 34 associated with the de-modifier 31. Hence, in the shown embodiment, the reading circuit 3 comprises two registers 33, 34. The de-modifier 31 receives the reading address 25 from the de-modifier register 34 and receives the extended read data 110 from the reader 30. In a different—not shown—embodiment, just one register is used (the reader-register is identical with the de-modifier-register) in which the reading address is written and from which the reading address is taken for reading the extended read data and for de-modifying it. Based on these data, the de-modifier 31 modifies the extended read data 110 in dependence on address information related to the reading address 25 in order to provide extracted read data 112 and an extracted error handling code 113 (see, e.g., FIG. 2). Hence, the de-modifier 31 reverses the modifications done by the modifier 11 of the writing circuit 1. Therefore, the modifier 11 of the writing circuit 1 needs to perform a reversible modification. Resulting from the de-modification, the de-modifier 31 obtains extracted read data 112 and an extracted error handling code 113. The extracted read data 112 and the extracted error handling code 113—in the shown embodiment—are comprised by de-modified extended read data 111.

The extracted error handling code 113 allows the error-detector 32 to detect whether the extracted read data 112 comprises an error. Such an error can occur when the extended read data 112 as such has an error. This is the common case which is covered by the error handling code. A different error arises if the modifier 11 and the writer 12 of the writing circuit 1 use different writing addresses or if the writer 12 writes the modified extended write data 102 in a wrong memory position. Still another error can happen on the side of the reading circuit 3 when the reader 30 and the de-modifier 31 use different reading addresses or if the extended read data 110 is read by the reader 30 from a wrong memory position.

In the shown embodiment, by modifying and de-modifying data comprising the write data and the corresponding error handling code based on the writing address and reading address, respectively, an error concerning the address becomes detectable using the error handling code. For this purpose, the error-detector 32 is configured at least to detect by mechanisms associated with the error handling code (here the extracted error handling code) an error within the data (here: the extracted read data). As the information about the address of the data is overlaid to the data, no additional space is needed. Further, one error detection mechanism can be used to detect errors concerning the data and concerning its address. Hence, no modifications concerning the error handling is necessary. Just a modifying and a de-modifying step as logic steps have to be added.

If no error is detected, the reading circuit 3 outputs in one embodiment the extracted read data 112. If an error is detected, the reading circuit 3 produces in one embodiment an alarm. In a further embodiment, the reading process is repeated.

In one embodiment, the error-detector 32 is configured for detecting errors having up to $n_{detect}$ bits. Further, the error-detector 32 is configured for correcting automatically errors having up to $n_{corr}$ bits. In one embodiment, the number $n_{detect}$ is greater than the number $n_{corr}$. The error-detector 32 allows to detect based on the extracted error handling code errors with up to $n_{detect}$ wrong bits. Errors with more than $n_{detect}$ wrong bits are not necessarily detected with 100% coverage. In one embodiment, the extracted error handling code allows to correct automatically errors with $n_{corr}$ bits. Hence, if an error has $n_{corr}$ wrong bits or less, it is automatically corrected. This automatic correction is suitable in case of genuine errors of the data but is not desirable for errors concerning the address as a correction of such an error is not possible by an error correction scheme but by writing the data on the correct position or by reading the data from the correct position. The numbers $n_{detect}$ and $n_{corr}$ are integers.

In order to avoid the automatic correction in the case of an address error, the evaluator 10 of the writing circuit 1 is configured for providing the error handling code 101 in such a way that the error handling code 101 allows detecting an error having up to $n_{detect}$ bits and allows correcting an error having up to $n_{corr}$ bits. In an embodiment, the number $n_{detect}$ is greater than the number $n_{corr}$. Hence, in one embodiment, the modifier 11 and the de-modifier 31 uses the same algorithm for detecting errors based on the extracted error handling code.

The automatic error correction is avoided by a writing circuit 1 according to an embodiment in which the modifier 11 is configured for reversibly modifying the extended write data 103 in such a way that the address information related to the writing address 21 affects $n_{mod}$ times the extended write data 103. Further, the integer number $n_{mod}$ is greater than the number $n_{corr}$. In this embodiment, a wrong address causes at least $n_{mod}$ erroneous bits. As the number $n_{mod}$ is greater than the number $n_{corr}$, such an error is beyond the range of the automatic correction. Hence, the error will be detected but not corrected.

Accordingly, in one corresponding embodiment, the de-modifier 31 of the reading circuit 3 is configured for modifying the extended read data 110 using at least $n_{mod}$ times the address information related to the reading address 25. The—in the discussed embodiment same—number $n_{mod}$ is also an integer and is greater than $n_{corr}$.

The kind of modification and de-modification fit to each other. This implies in one embodiment, that the modifier 11 (compare FIGS. 1 and 2) is configured for reversibly modifying the extended write data 103 by applying an XOR-operation to the extended write data 103 and to enlarged writing address data 104 comprising at least $n_{mod}$ times the address information related to the writing address 21. The XOR-operation or exclusive OR-operation is a logic operation. In an embodiment, the de-modifier 31 is configured for modifying the extended read data 110 by applying an XOR-operation to the extended read data 110 and to enlarged read address data 114 comprising at least $n_{mod}$ times the address information related to the reading address 25. In one embodiment, the modifier 11 and the de-modifier 31 apply the same operation to the data to be modified and de-modified, respectively. In one embodiment—for example without an automatic correction due to the error handling code—the number $n_{mod}$ is set as 1.

In different embodiments, the modifier 11 applies a subtraction-operation or an addition-operation on the extended write data 110 and the enlarged writing address data 104. In corresponding or separate embodiments, the de-modifier 31 uses an addition-operation or a subtraction-operation to the extended read data 110 and to the enlarged read address data 114. In one embodiment, the modifier 11 applies an addition-operation to the extended write data 103 and the enlarged writing address data 104, while the de-modifier 31 subtracts the enlarged read address data 114 from the extended read data 110. In this embodiment, the enlarged writing address data 104 and the enlarged reading address data 114 are provided using the same number $n_{mod}$. In a different embodiment, the modifier 11 calculates the difference between the extended write data 103 and the enlarged writing address data 104 while the de-modifier 31 adds the enlarged read address data 114 to the extended read data 110.

The method for reading extended read data from a memory comprising at least the following steps:
Reading the extended read data from a position of the memory defined by a reading address.
Modifying the extended read data in dependence on address information related to a reading address in order to provide extracted read data and an extracted error handling code.
Detecting whether the extracted read data comprises an error. This detection is done based on the extracted error handling code.

In one embodiment, the reading address for reading the extended read data and the reading address for modifying the extended read data are taken from different registers or memory locations. If concerning the addresses no error occur, both reading address are identical.

According to a different embodiment, the modifier 11 is configured to reversibly modify the extended write data 103 in dependence on address information related to a fraction of a writing address 20, 21 defining more than one memory positions of the memory 2 in order to provide the modified extended write data 102. In this embodiment, not the entire writing address is used but just a fraction or part of it referring to various different positions of the memory. The modified extended write data 102, thus, refers not to one single memory position but to a kind of cluster or plurality of memory positions. In a further embodiment, the writer 12 is configured to write the modified extended write data 102 in more than one positions of the memory 2 defined by a writing address 20, 22. More precisely, the modified extended data 102 is written into the memory positions defined by the fraction of the writing address used for the modification of the extended write data 103.

In another embodiment, the de-modifier 31 is configured for modifying the extended read data 110 in dependence on address information related to a fraction of a reading address 23, 25 defining more than one memory positions of the memory 2 in order to provide extracted read data 112 and an extracted error handling code 113. In this embodiment, not the complete address information specifying a specific memory position is used but a fraction which refers to more than one positions of the memory.

FIG. 2 shows again an arrangement of writing and reading data to and from a memory 2, respectively, partially in the way of a flow chart of the respective data. In one embodiment, the writing and reading operation are performed by two different circuits or units. In a different embodiment, both operations are executed by the same circuit or unit.

The writing operation (shown here in the upper part) starts with the write data 100 which is given to an evaluator 10. The evaluator 10 provides an error handling code 101 based on the write data 100. The error handling code 10 is in the shown embodiment an ECC, i.e., an error correction code, thus, allowing to detect and to correct errors in the associated data. The error handling code 101 is a set of data that is combined with the write data 100 in order to get extended write data 103. Hence, the extended write data 103 comprises the write data 100 as well as information allowing to detect whether an error occurred within the write data 100.

The writing address 21 that defines the position of the memory 2 into which the write data 100 is to be written is used to obtain enlarged writing address data 104. The enlarged writing address data 104 comprises $n_{mod}$ times the data of the writing address 21. Here, the writing address 21 is added $n_{mod}$ times one behind the other. In an embodiment the number $n_{mod}$ it set to 4. This is especially done for an embodiment in which the error handling code allows to detect errors having up to $n_{detect}=4$ erroneous bits and to correct the detected errors with up to $n_{corr}=3$ erroneous bits. In one embodiment, the number $n_{detect}$ is greater than $N_{corr}$. In one embodiment, the number $n_{mod}$ is set to the number $n_{detect}$. In this embodiment, an error in the address will cause $n_{mod}$ errors and will be detected, as $n_{mod}$ equals $n_{detect}$, but will not be corrected, as the numbers $n_{mod}=n_{detect}$ is greater than the number $N_{corr}$.

In one exemplary embodiment, the write data 100 has 64 bits and the error handling code 101 has 22 bits, resulting in extended write data 103 with 86 bits. The write address 21 may have 20 bits. With a number $n_{mod}=4$, the enlarged writing address data 104 has 80 bits.

The extended write data 103 and the enlarged writing address data 104 are given to a modifier 11 which in the shown embodiment uses an XOR-operation onto both data 103, 104 in order to provide modified extended write data 102. The modified extended write data 102 is, thus the combination of the address information with the original write data plus the information for handling possible errors happening to the original write data. In order to obtain the extended write data 103 after the reading operation, the modification has to be reversible.

In the shown embodiment, the modified extended write data 102 is written in the memory 2. For the writing operation, reference is made to the writing address 22 (i.e. second writing address 22) which is taken in the shown embodiment from a different register than the writing address 21 (this one can accordingly be named first writing address 21) used for modifying the extended write data 103. If no error occurred, both writing addresses 21, 22 are identical and the first writing address 21 and the second writing address 22 are just the writing address. In a further—not shown—embodiment, one register is used, so that the first writing address 21 and the second writing address 22 are identical to each other and are the writing address given to the writing circuit 1.

After the writing operation, the memory 2 contains at least one modified extended write data 102 at a position defined by a writing address. Usually, the memory 2 will contain many different data located at different positions. The following reading operation is one embodiment for retrieving the data from the memory 2.

The data are here read as extended read data 110 from at least one position of the memory 2 defined by the reading address 24. The reading address 24 (similar to the wording for the writing operation, a different name might be: first reading address 24) is for the access of the memory 2 taken from one register. For the de-modification, the reading address 25 (or so called second reading address 25) is taken in the shown embodiment from a different register. If no error occur with the registers for the reading addresses, the first reading address 24 equals the second reading address 25 and both are just the reading address.

The extended read data 110 is fed to a de-modifier 31. The de-modifier 31 also receives the reading address 25 in form of the enlarged read address data 114 in order to "extract" de-modified extended read data 111. The enlarged read address data 114 comprises $n_{mod}$ times the reading address (or second reading address) 25 with the same number $n_{mod}$ used for the enlarged writing address data 104 for the modification during the writing operation. In a different embodiment, in which the error handling code only allows to detect errors, the number $n_{mod}$ equals or is greater than the number of bits necessary for detecting a data error.

The de-modification is performed with a kind of operation reversing the operation used for the modification as part of the writing operation. As in the shown embodiment an XOR-operation was used for modifying the extended write data 103, also an XOR-operation is used for the de-modification.

The de-modified extended read data 111 comprises extracted read data 112 and an extracted error handling code 113. The modification of the extended write data 103 is performed so that the writing address affects the write data 100 as well as the error handling code 101. This implies that an error during the writing operation or during the reading operation affects both of them.

In order to see whether an error occurred, the extracted read data 112 and the extracted error handling code 113 are submitted to an error-detector 32. The error-detector 32 is configured for detecting such an error in the extracted read data 112 based on the extracted error handling code 113. In this step, an error due to a wrong position of the memory 2 either during the writing operation or during the reading operation will become apparent. This is especially due to the fact, that the writing/reading address affects the data and the error handling code. If no error is detected and extracted read data 112 are consistent with the extracted error handling code 113, then—in the shown embodiment—the extracted read data 112 is output as the data available at the given reading address.

Figure 3:
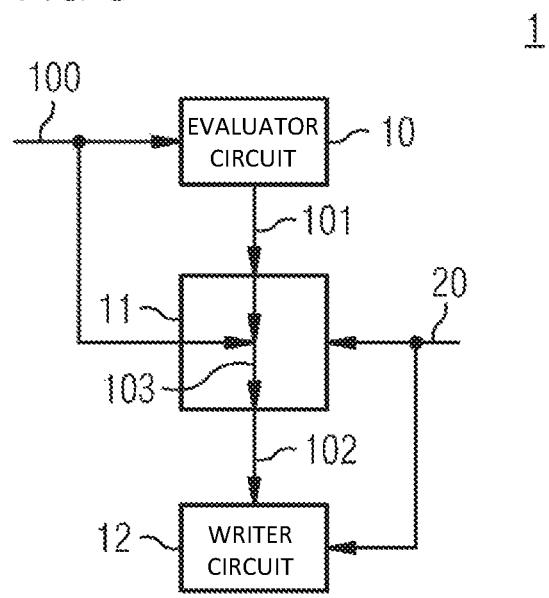
FIG. 3 illustrates an embodiment of a writing circuit.

FIG. 3 shows an embodiment of a writing circuit 1 for writing write data 100. The evaluator 10 receives the write data 100 and provides an error handling code 101 on the basis of the write data 100. The write data 100 and the error handling code 101 are received by a modifier 11. The write data 100 and the error handling code 101 form extended write data 103 which is modified reversibly by the modifier 11 in dependence on address information related to a writing address 20. The reversible modification leads to modified extended write data 102 comprising the write data 100, the corresponding error handling code 101 allowing at least to detect errors in the write data 100, and the address information related to the writing address 20. The modified extended write data 102 is written by the writer 12 in a position of the memory defined by the writing address 20.

Figure 4:
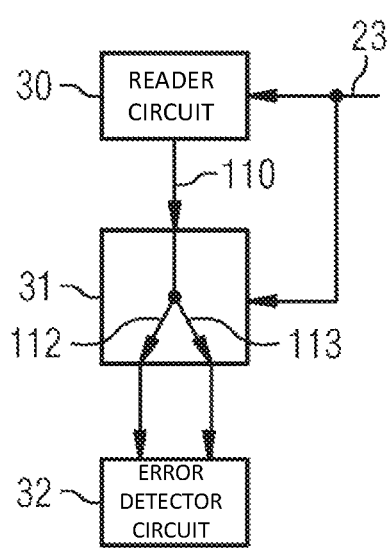
FIG. 4 shows an embodiment of a reading circuit.

The reading circuit 3 shown in FIG. 4 allows reading extended read data 110 from a memory. The reader 30—being the part of the reading circuit 3 actually interacting with the memory—is configured for reading the extended read data 110 from a position of the memory defined by a reading address 23 submitted to the reader 30. The extended read data 110 is submitted to the de-modifier 31 that additionally receives the reading address 23. The de-modifier 31 (de-) modifies the extended read data 110 and, thus, reverses the modification done in the writing operation. The modification is based on address information related to the reading address 23 and results in extracted read data 112 and an extracted error handling code 113. Based on the error-handling code 113 the next step—performed by a error-detector—provides information about whether the extracted read data 112 comprises an error.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

As the description refers to illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

The invention claimed is:

1. A writing circuit for writing write data into a memory, comprising:
an evaluator configured for providing an error handling code on the basis of the write data,
a modifier configured for providing modified extended write data,
wherein the modifier is configured to reversibly modify extended write data comprising both the write data and the error handling code by applying a mathematical operation or a Boolean operation to the extended write data and address information related to a writing address in order to provide the modified extended write data, and
a writer configured for writing the modified extended write data in a position of the memory defined by a writing address.

2. The writing circuit of claim 1,
wherein the evaluator is configured for providing the error handling code in such a way that the error handling code allows detecting an error having up to $n_{detect}$ bits and allows correcting an error having up to $n_{corr}$ bits, and
wherein the number $n_{detect}$ is greater than the number $n_{corr}$.

3. The writing circuit of claim 2,
wherein the modifier is configured for reversibly modifying the extended write data in such a way that the address information related to the writing address affects $n_{mod}$ times the extended write data, and
wherein the number $n_{mod}$ is greater than the number $n_{corr}$.

4. The writing circuit of claim 3,
wherein the modifier is configured for reversibly modifying the extended write data by applying an XOR-operation to the extended write data and to enlarged writing address data comprising at least $n_{mod}$ times the address information related to the writing address.

5. The writing circuit of claim 3,
wherein the modifier is configured for reversibly modifying the extended write data by applying a subtraction-operation to the extended write data and to enlarged writing address data comprising at least $n_{mod}$ times the address information related to the writing address.

6. The writing circuit of claim 3,
wherein the modifier is configured for reversibly modifying the extended write data by applying an addition-operation to the extended write data and to enlarged writing address data comprising at least $n_{mod}$ times the address information related to the writing address.

7. The writing circuit of claim 1,
wherein the modifier is configured to reversibly modify the extended write data in dependence on address information related to a writing address obtained from a modifier-register.

8. The writing circuit of claim 1,
wherein the writer is configured to write the modified extended write data in a position of the memory defined by a writing address obtained from a writer-register.

9. The writing circuit of claim 1,
wherein the modifier is configured to reversibly modify the extended write data in dependence on address information related to a fraction of a writing address defining more than one memory position of the memory in order to provide the modified extended write data.

10. A method for writing write data into a memory, comprising:
providing an error handling code based on the write data, reversibly modifying extended write data comprising both the write data and the error handling code by applying a mathematical operation or a Boolean operation to the extended write data and address information related to a writing address in order to provide modified extended write data, and writing the modified extended write data in a position of the memory defined by a writing address.

11. A reading circuit for reading extended read data from a memory, comprising:
- a reader configured for reading the extended read data from a position of the memory defined by a reading address,
- a de-modifier configured for modifying the extended read data by applying a reverse mathematical operation or a Boolean operation to the extended read data from the memory and address information related to a reading address in order to provide extracted read data and an extracted error handling code, and
- an error-detector configured for detecting based on the extracted error handling code whether the extracted read data comprises an error.

12. The reading circuit of claim 11,
wherein the error-detector is configured for detecting errors having up to $n_{detect}$ bits,
wherein the error-detector is configured for correcting automatically errors having up to $n_{corr}$ bits, and
wherein the number $n_{detect}$ is greater than the number $n_{corr}$.

13. The reading circuit of claim 12,
wherein the de-modifier is configured for modifying the extended read data using at least $n_{mod}$ times the address information related to the reading address, and
wherein the number $n_{mod}$ is greater than the number $n_{corr}$.

14. The reading circuit of claim 13,
wherein the de-modifier is configured for modifying the extended read data by applying an XOR-operation to the extended read data and to enlarged read address data comprising at least $n_{mod}$ times the address information related to the reading address.

15. The reading circuit of claim 13,
wherein the de-modifier is configured for modifying the extended read data by applying an addition-operation to the extended read data and to enlarged read address data comprising at least $n_{mod}$ times the address information related to the reading address.

16. The reading circuit of claim 13,
wherein the de-modifier is configured for modifying the extended read data by applying a subtraction-operation to the extended read data and to enlarged read address data comprising at least $n_{mod}$ times the address information related to the reading address.

17. The reading circuit of claim 11,
wherein the reader is configured to read the extended read data from a position of the memory defined by a reading address obtained from a reader-register.

18. The reading circuit of claim 11,
wherein the de-modifier is configured to modify the extended read data in dependence on address information related to a reading address obtained from a de-modifier-register.

19. The reading circuit of claim 11,
wherein the de-modifier is configured for modifying the extended read data in dependence on address information related to a fraction of a reading address defining more than one memory position of the memory in order to provide extracted read data and an extracted error handling code.

20. A method for reading extended read data from a memory, comprising:
- reading the extended read data from a position of the memory defined by a reading address,
- modifying the extended read data in dependence on address information related to a reading address by applying a reverse mathematical operation or a Boolean operation in order to provide extracted read data and an extracted error handling code, and
- detecting based on the extracted error handling code whether the extracted read data comprises an error.

* * * * *